United States Patent
Ning

(10) Patent No.: US 6,635,496 B2
(45) Date of Patent: Oct. 21, 2003

(54) PLATE-THROUGH HARD MASK FOR MRAM DEVICES

(75) Inventor: Xian J. Ning, Mohegan Lake, NY (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 09/977,027

(22) Filed: Oct. 12, 2001

(65) Prior Publication Data

US 2003/0073251 A1 Apr. 17, 2003

(51) Int. Cl.⁷ .................. H01L 21/00; H01L 21/8242
(52) U.S. Cl. .................. 438/3; 438/253; 438/396
(58) Field of Search .................. 438/3, 239, 253, 438/396

(56) References Cited

U.S. PATENT DOCUMENTS

| | | | | |
|---|---|---|---|---|
| 5,266,519 A | * | 11/1993 | Iwamoto | 205/123 |
| 5,695,810 A | | 12/1997 | Dubin et al. | |
| 6,153,443 A | * | 11/2000 | Durlam et al. | 257/295 |
| 6,174,737 B1 | * | 1/2001 | Durlam et al. | 438/3 |
| 6,180,505 B1 | * | 1/2001 | Uzoh | 257/737 |
| 6,383,920 B1 | * | 5/2002 | Wang et al. | 438/637 |
| 6,440,753 B1 | * | 8/2002 | Ning et al. | 438/3 |
| 2002/0098281 A1 | * | 7/2002 | Ning | 427/129 |

OTHER PUBLICATIONS

Wong, et al., "Metallization by plating for high-performance multichip modules", IBM J. Res. Develop., Sep. 1998, pp. 587–596, vol. 42 No. 5.

D'Asaro, et al., "Improved Performance of GaAs Microwave Field–Effect Transistors with Low Inductance Via–Connections Through the Substrate", IEEE Transactions on Electron Devices, Oct. 1978, pp. 1218–1221, vol. Ed–25, No. 10.

Ishikawa, et al., "A High–Power GaAs FET Having Buried Plated Heat Sink for High–Performance MMIC's ", IEEE Transactions on Electron Devices, Jan. 1994, pp. 5–9, vol. 41, No. 1.

Svendsen, et al., "Chemically Deposited Ni–P and Ni–P–W Layers Investigated by Means of Rutherford Backscattering Spectrometry", J. Electrochem. Soc.: Solid–State Science and Technology, Nov. 1983, pp. 2256–2259, vol. 130, No. 11.

* cited by examiner

Primary Examiner—John F. Niebling
Assistant Examiner—Jennifer M. Kennedy
(74) Attorney, Agent, or Firm—Slater & Matsil, L.L.P.

(57) ABSTRACT

A method of fabricating an MRAM device includes patterning a magnetic stack material layer (142) using a herd mask (146) formed by a "plate-through" technique. A resist (144) is deposited over magnetic stack material (142), and the resist (144) is patterned, exposing regions of the magnetic stack material (142). A hard mask (146) is formed over the magnetic stack material (142) exposed regions through the resist (144), and the hard mask (146) is used to pattern magnetic tunnel junctions (MTJ's) of the MRAM device. Electroplating, electro-less plating, sputtering, physical vapor deposition (PVD), evaporation deposition, or combinations thereof are used to deposit a material comprising a metal over the magnetic stack material (142) exposed regions to form the hard mask (146).

20 Claims, 5 Drawing Sheets

US 6,635,496 B2

PLATE-THROUGH HARD MASK FOR MRAM DEVICES

TECHNICAL FIELD

The present invention relates generally to the fabrication of semiconductor devices, and more particularly to magnetic random access memory (MRAM) devices.

BACKGROUND OF THE INVENTION

Semiconductors are used for integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A more recent development in memory devices involves spin electronics, which combines semiconductor technology and magnetics. The spin of an electron, rather than the charge, is used to indicate the presence of a "1" or "0". One such spin electronic device is an MRAM device, which includes conductive lines positioned perpendicular to one another in different metal layers, the conductive lines sandwiching a magnetic stack. The place where the conductive lines, e.g., wordlines and bitlines, intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell array is generally constructed by placing the conductive lines and cross-points in a matrix structure having rows and columns.

An advantage of MRAM devices compared to traditional semiconductor memory devices such as DRAM devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data.

Because MRAM devices operate differently than traditional memory devices, they introduce design and manufacturing challenges.

SUMMARY OF THE INVENTION

Preferred embodiments of the present invention achieve technical advantages as a plate-through technique for fabricating metal hard masks for patterning magnetic stack material of MRAM devices.

In one embodiment, disclosed is a method of fabricating a resistive semiconductor memory device, comprising forming a plurality of first conductive lines, forming a magnetic stack material over the first conductive lines and depositing a resist over the magnetic stack material. The method includes patterning the resist, removing portions of the resist to expose regions of the magnetic stack material, and depositing a hard mask material over the exposed regions of the magnetic stack material to form a hard mask.

In another embodiment, disclosed is a method of fabricating a MRAM device, comprising providing a workpiece, depositing a first insulating layer over the workpiece, forming a plurality of first conductive lines within the first insulating layer, and depositing a magnetic stack material over the first conductive lines and first insulating layer. The method includes depositing a resist over the magnetic stack material, patterning the resist, removing portions of the resist to expose regions of the magnetic stack material, and depositing a hard mask material over the exposed regions of the magnetic stack material through the resist to form a hard mask. The resist is removed, and the hard mask is used to pattern the magnetic stack material and form magnetic tunnel junctions. (MTJ's).

Advantages of embodiments of the invention include providing a method of forming a hard mask over a magnetic stack material layer of an MRAM device that does not require a metal etch process. The pattern shape of a lithography mask pattern for MTJ shape is better preserved compared with methods of forming bard masks that require a metal etch process. Hard mask formation using metal etch processes typically have basics, resulting in patterns that are smaller than desired, and corner rounding of features. Forming a hard mask for a magnetic material stack using a plate-through process in accordance with embodiments of the invention provides a method of precisely patterning of MTJ's an MRAM device. Further advantages include process simplification and better contraindication control. The lithography process window is improved, because the process window for printing voids in a material is, in general, larger than process windows for printing pillars.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Preferred embodiments of the present invention will be described, followed by some advantages of embodiments of the present invention.

To manufacture MRAM devices, typically, magnetic metal stacks are embedded in the back-end-of-line (BEOL) while manufacturing the integrated circuits (ICs). A magnetic stack comprises many different layers of metals with a thin layer of dielectric therebetween. The magnetic stack may have a total thickness of a few tens of nanometers, for example. For cross-point MRAM structures, the magnetic stack is usually located at the intersection of two metal wiring levels, for example, at the intersection of metal 2 (M2) and metal 3 (M3) layers that run in different directions positioned at an angle to one another. The tops and bottoms of the magnetic stacks typically contact the M2 and M3 wiring layer conductive lines, respectively.

Figure 1:
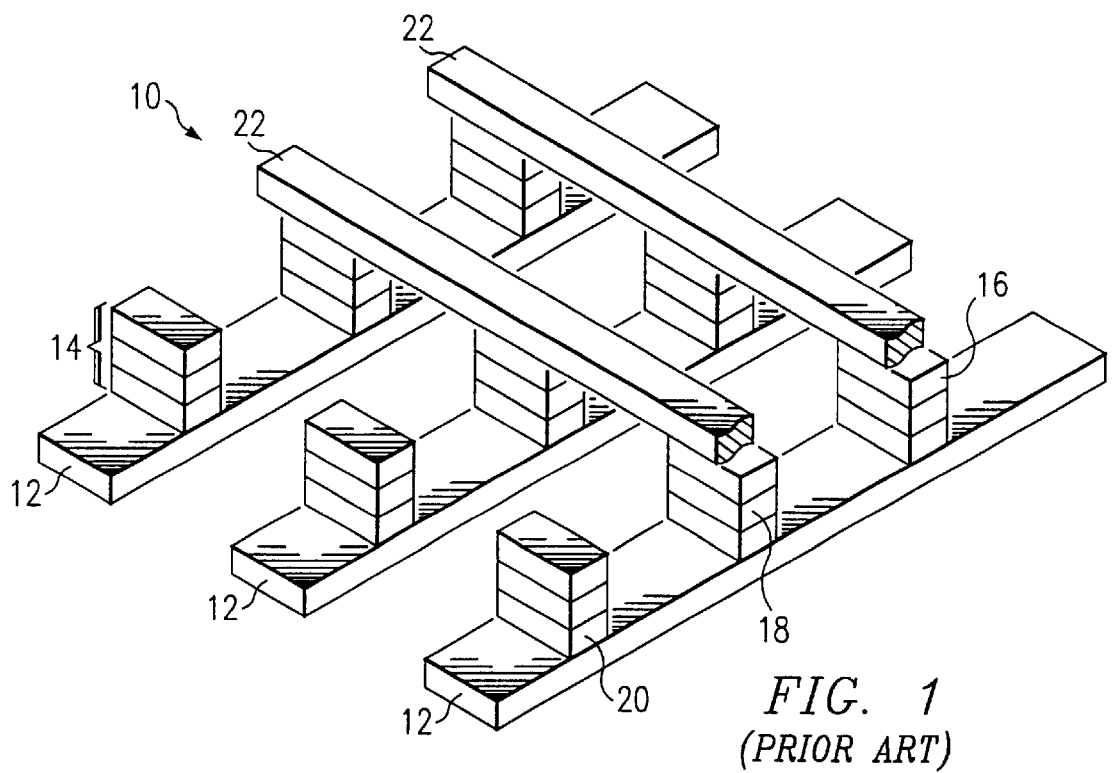
FIG. 1 illustrates a perspective view of a prior art MRAM device having magnetic stack memory cells arranged in an array, with wordlines and bitlines disposed below and above each memory cell for accessing the memory cells.

A prior art MRAM device 10 having conductive lines 12 and 22 running in a first and second direction and comprised of a conductive material such as aluminum or copper, for example, is shown in FIG. 1. A first inter-level dielectric layer (not shown) is deposited over a workpiece (not shown). A metallization layer is formed, typically in the inter-level dielectric layer, using a damascene process to form the conductive lines 12. A magnetic stack 14 is formed over conductive lines 12.

The magnetic stack 14 typically comprises a first magnetic layer 20 including a plurality of layers of materials such as PtMn, CoFe, Ru, $Al_2$, $O_3$, and NiFe, for example. The first magnetic layer 20 is often referred to as a hard layer. Magnetic stack 14 also includes a dielectric layer 18, comprising $Al_2O_3$, for example, deposited over the first magnetic layer 20. The dielectric layer 18 is often referred to as a tunnel layer. Magnetic stack 14 also includes a second magnetic layer 16 comprising a multi-layer structure having similar materials as the first magnetic layer 20 deposited over the dielectric layer 18. Second magnetic layer 16 is often referred to as a soft layer. The first magnetic layer 20, dielectric layer 18 and second magnetic layer 16 are patterned to form magnetic stacks 14.

Conductive lines 22 within a metallization layer running in a different direction than, e.g., perpendicular to, conductive lines 12 are formed over magnetic stacks 14, typically using a damascene process, within a dielectric layer (not shown) deposited over magnetic stacks 14 and conductive lines 22. Conductive lines 12 and 22 function as the wordlines and bitlines of the memory array 10. The order of the magnetic stack 14 layers may be reversed, e.g., the hard layer 20 may be on the top and the soft layer 16 may be on the bottom of the insulating layer 18, for example. Similarly, the wordlines 12 and bitlines 22 may be disposed either above or below the magnetic stacks 14.

In an MRAM device, information is stored in the soft magnetic layer 16 of the magnetic stacks 14. To store the information, a magnetic field is necessary. This magnetic field is provided by a wordline and bitline current which is passed through conductive lines 12 and 22. The information is read by applying a voltage to the particular cell to be read, and determining the resistance value of the cell, which indicates a "1" or "0" logic state.

Patterning of the magnetic stacks 14 of MRAM devices is important because the shape of the magnetic stacks 14 impacts the performance of the MRAM device. Embodiments of the present invention provide a method of precise patterning of magnetic stacks of an MRAM device using a plate-through method of forming a hard mask over a magnetic stack material layer.

Figure 2:
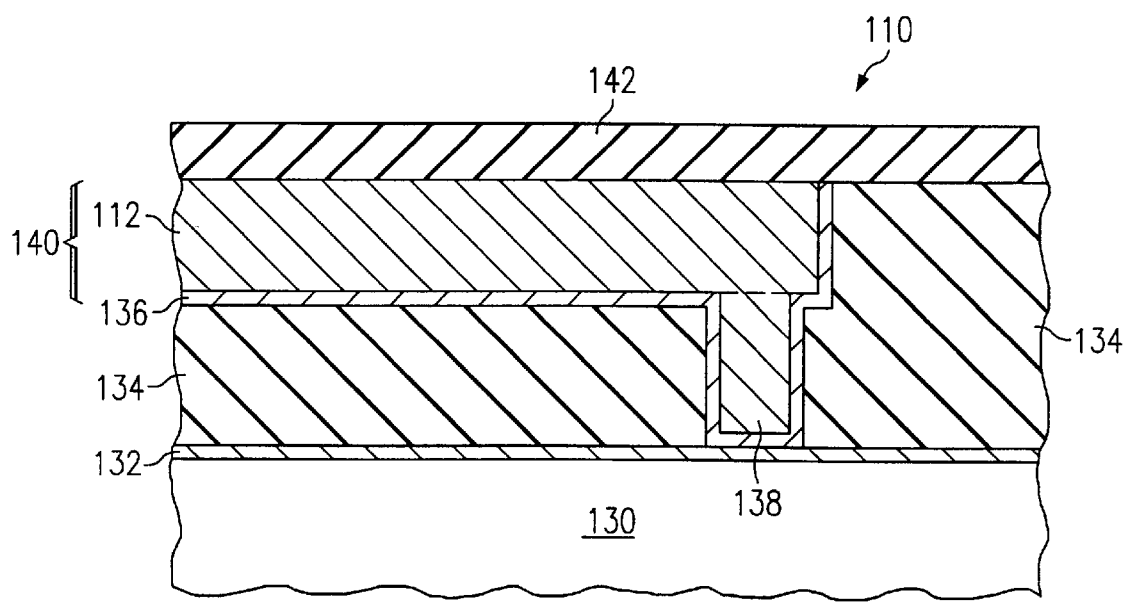
FIGS. 2 through 8 show cross-sectional views of an MRAM device at various stages of fabrication in accordance with an embodiment of the present invention.

FIGS. 2 through 8 show cross-sectional views of an MRAM device at various stages of fabrication in accordance with an embodiment of the invention. FIG. 2 shows a semiconductor wafer 110 including a workpiece 130. The workpiece 130 may include a semiconductor substrate comprising silicon or other semiconductor materials covered by an insulating layer, for example. The workpiece 130 may also include other active components or circuits formed in the front end of the line (FEOL), not shown. The workpiece 130 may comprise silicon oxide over single-crystal silicon, for example. The workpiece 130 may include other conductive layers or other semiconductor elements, e.g. transistors, diodes, etc. Compound semiconductors such as GaAs, InP, Si/Ge, SiC, as examples, may be used in place of silicon.

An optional thin cap layer 132 may be formed over the workpiece 130. The cap layer 132 preferably comprises a thin layer of protective material adapted to prevent diffusion of the metal used for first conductive lines 112/136 into the workpiece 130. For example, if copper is used for the first conductive line 140 material, copper has a tendency to diffuse into underlying and overlying dielectrics unless a cap layer 132 is used. Because copper oxidizes easily, when the first conductive lines 140 comprise copper, preferably, cap layer 132 comprises a material other than an oxide, to avoid oxidation of first conductive lines 140. Cap layer 132 may comprise a nitride such as $Si_xN_y$, for example, where x and y are integers of 1 or greater.

A first insulating layer 134 is deposited over the cap layer 132. The first insulating layer 134 preferably comprises an inter-level dielectric (ILD) layer, e.g., the wafer first inter-level dielectric. The first insulating layer 134 preferably comprises silicon dioxide ($SiO_2$) and may alternatively comprise other dielectric materials such as low dielectric constant materials or high dielectric constant materials, for example.

The first insulating layer 134 is patterned, etched, and filled with a conductive material 112 to form first conductive lines 140, preferably in a damascene process. The pattern and fill process may comprise a single damascene or dual-damascene process (as shown, with via 138 being filled at the same time first conductive line 140 is filled), for example. The first insulating layer 134 may be lithographically patterned and reactive ion etched (RIE) to form trenches where first conductive lines 140 will be formed. The trenches may be 0.2 $\mu$m wide and 0.4 to 0.6 $\mu$m deep, as examples.

Depending on the conductive material 112 used, conductive lines 140 may include an optional liner 136. For example, if first conductive lines 140 comprise copper, preferably, liner 136 comprises a copper liner deposited over the wafer surface within the trenches, including along the trench sidewalls, and liner 136 also preferably includes a seed layer formed over the copper liner, adapted to improved the deposition of the conductive material 112. Conductive material 112, comprising copper in this embodiment, is then deposited over the wafer 110 and within the trenches. First conductive lines 140 may comprise minimum pitched lines (e.g., having the smallest feature size) or larger pitched lines. The wafer 110 is chemically-mechanically polished (CMP'd) to remove the excessive conductive material 112/136 above the top surface of the first insulating layer 134.

First conductive lines 140 comprise a first conductive material 112 preferably comprising a metal such as copper, and alternatively comprising other conductive materials such as Al, TiN, Ti, W, combinations thereof, or other conductive materials, deposited by physical vapor deposition (PVD) or chemical vapor deposition (CVD), as examples. Conductive lines 140 in an MRAM preferably comprise copper, which is desirable for its superior conductivity and the ability to use smaller conductive lines because of the improved conductivity of the copper. A damascene process is preferably used to form conductive lines 140 comprising copper, because copper is difficult to etch. First conductive lines 140 may be part of an M1 or M2 metallization layer, as examples.

Next, a magnetic stack material 142 layer is formed over first conductive lines 140 and first insulating layer 134. Magnetic stack material 142 typically comprises a first magnetic layer comprised of a plurality of layers of materials such as PtMn, CoFe, Ru, NiFe, Ni, Co, and/or combinations thereof, using various ratios of these chemical elements, as examples.

Magnetic stack material 142 includes a dielectric layer, comprising aluminum oxide ($Al_2O_3$), for example, deposited over the first magnetic layer. Magnetic stack material 142 also includes a second magnetic layer deposited over the dielectric layer, the second magnetic layer comprising a similar multi-layer structure using similar materials as the first magnetic layer.

The next processing procedure typically required in fabricating an MRAM device is to pattern the magnetic stack material 142 into a plurality of magnetic stacks. Embodiments of the present invention provide methods of patterning the magnetic stack material 142 to form magnetic stacks or magnetic tunnel junctions (MTJ's) of an MRAM or other resistive memory device.

In accordance with an embodiment of the invention, a hard mask is formed using a "plate-through" process over the magnetic stack material 142, and the hard mask is then used to pattern the array of MTJ's. The term "plate-through" as used herein is defined as depositing or forming material on a surface through openings in a resist by plating, deposition, or other material-forming techniques.

Figure 3:
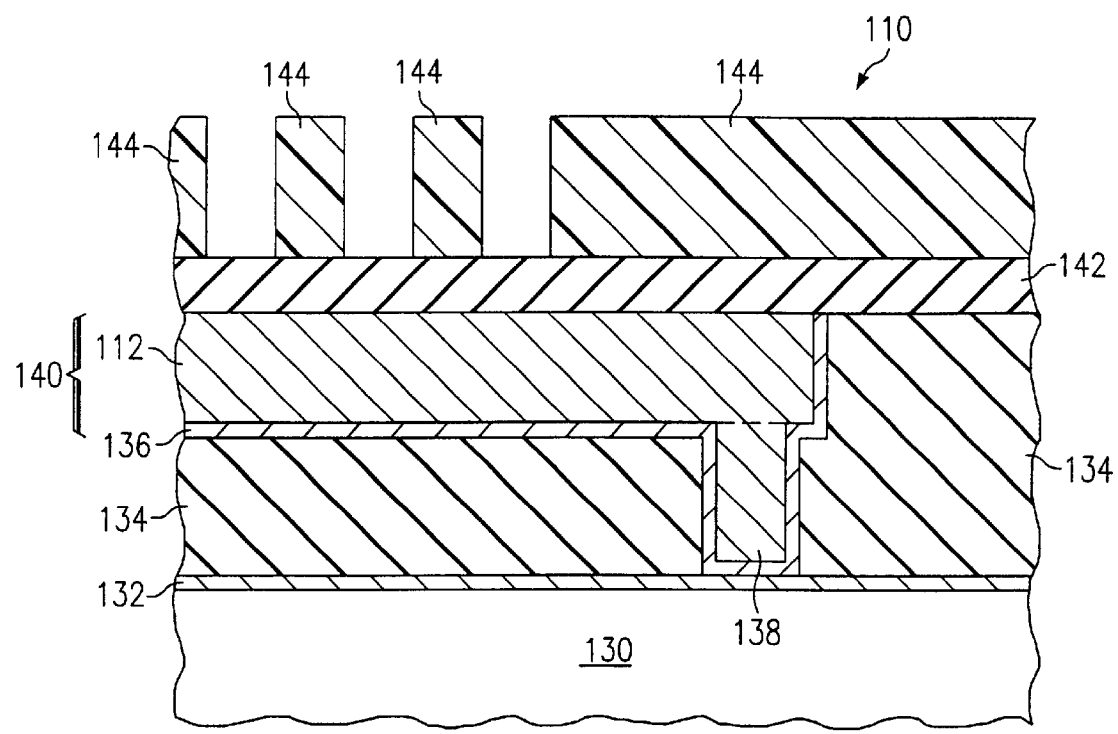

A resist 144 is deposited over the magnetic stack material 142 of the wafer 110, as shown in FIG. 3. The resist 144 typically comprises an organic polymer, for example. The resist 144 is patterned using lithography, e.g., a lithography mask, not shown, may be used to pattern the resist 144 with a predetermined pattern that defines the shape, size and location for the MTJ's within the magnetic stack material 142. The wafer 110 may be exposed through a lithography mask, for example, by exposure to a UV light, and developed to remove undesired portions of resist 144 using either a positive or negative exposure process, leaving the structure shown in FIG. 3 having resist portions residing over portions of the magnetic stack material 142, and leaving portions of the magnetic stack material 142 exposed. Alternatively, the lithography process may comprise, e.g., electron beam, x-ray and photo processes. Preferably, in accordance with embodiments of the present invention, the lithographic pattern comprises the reversed tongs of an MTJ pattern, that is, after exposure and cleaning of the resist 144, resist 144 resides everywhere on the wafer 110 except where MTJ's will be formed in the finished MRAM device.

Figure 4:
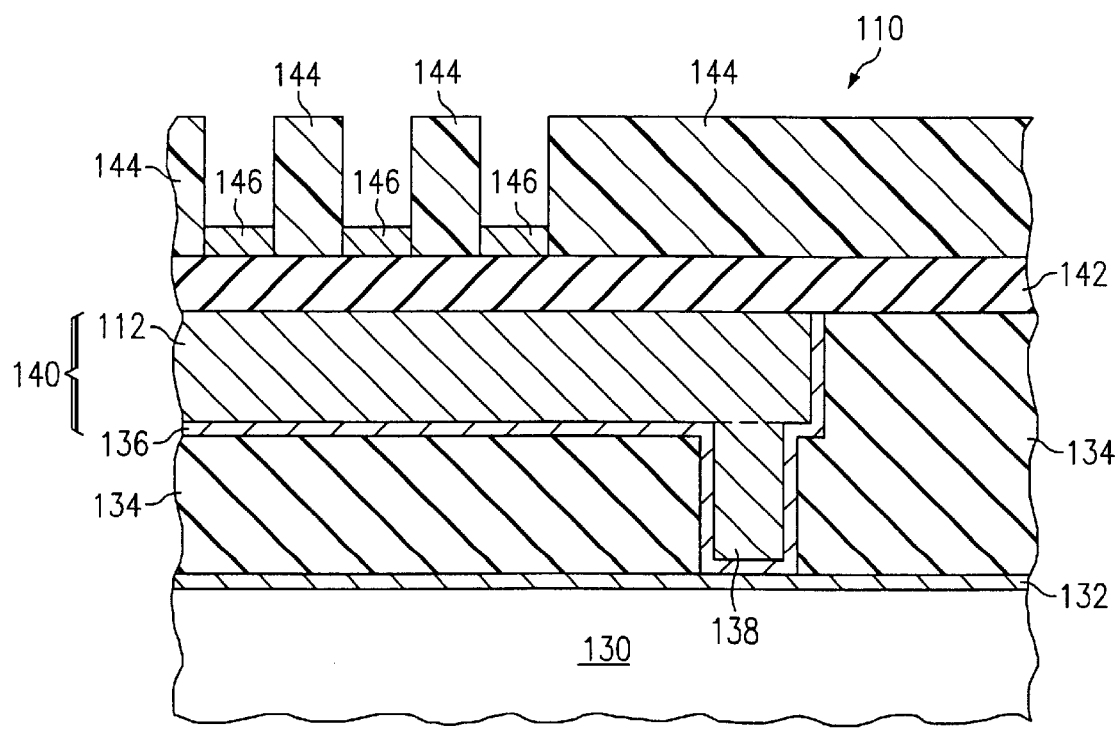

A plate-through material formation process is then performed on the wafer 110, as shown in FIG. 4, to form a hard mask 146 over the magnetic stack material 142 through openings in the resist 144. Preferably, the hard mask 146 comprises a metal that is plated or deposited within openings of the resist 144 pattern. An electroplating or electro-less plating process may be used to form hard mask 146. For example, an electro-plating process may be used to deposit Cu, Au, or Ni, and/or an electro-less plating process may be used to deposit Pd/Au, Pd/Ni, CoPW, or CoP. Alternatively, TaN, Ta, TiN, or W may be deposited, e.g., by sputtering, physical vapor deposition (PVD), and/or evaporation deposition. Furthermore, combinations of the aforementioned materials and other metals may be deposited to form hard mask 146 using combinations of plating and/or deposition processes.

During the plate-through process, the hard mask 146 is deposited directly on the top surface of the magnetic stack material 142. The hard mask 146 is preferably of a sufficient thickness to serve as a hard mask 146 for etching the magnetic material layer 142, e.g., approximately 10 to 40 nm thick.

Figure 5:
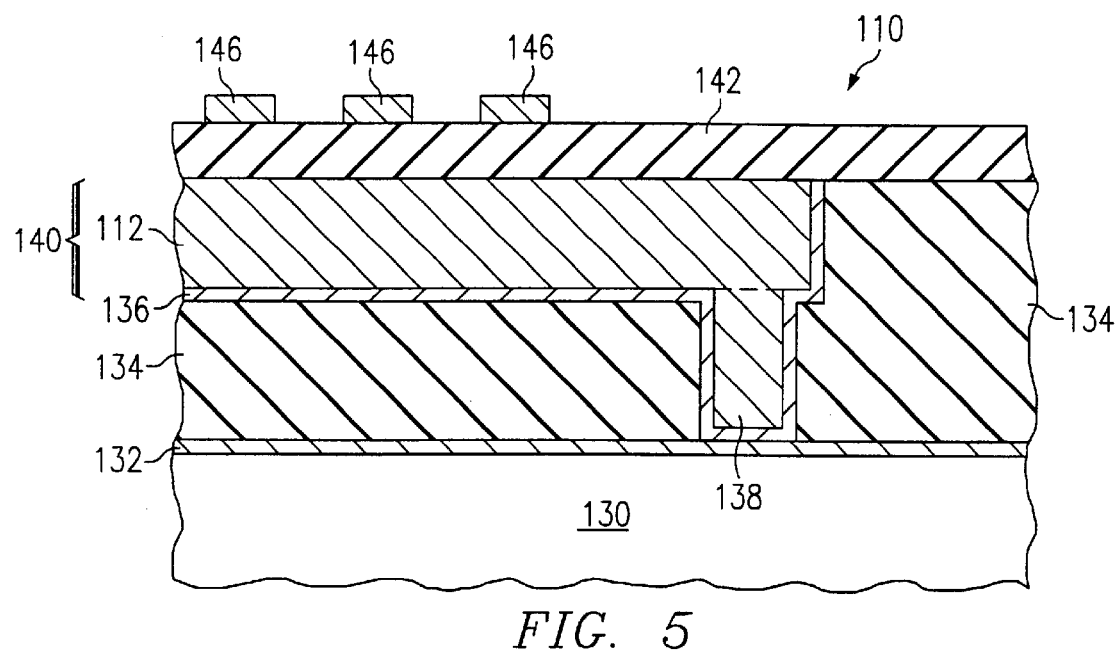

Next, the remaining resist 144 is removed from the wafer 110, as shown in FIG. 5. For example, the residual resist 144 may be stripped and cleaned from the wafer 110. The hard mask 146 is left remaining on top of the magnetic stack material 142.

Figure 6:
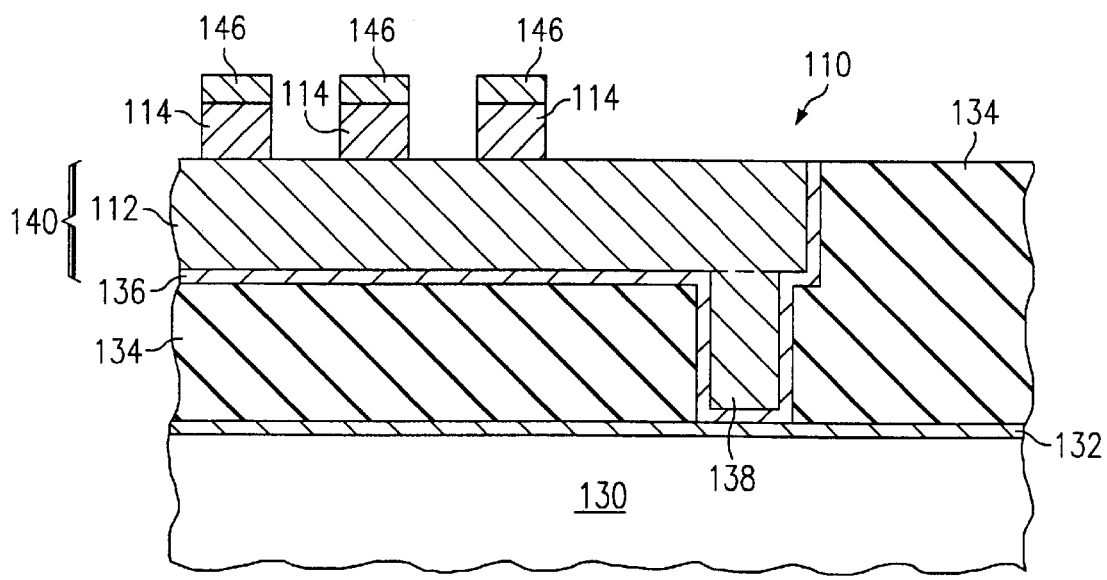

The hard mask 146 is used to pattern the magnetic stack material 142 and form MTJ's 114, as shown in FIG. 6. An etch process such as reactive ion etching (RIE), or ion milling, may be used to transfer the pattern the magnetic stack material 142, as examples. The MTJ's 114 may be rectangular or oval in shape, for example, and alternatively may comprise other shapes.

Figure 7:
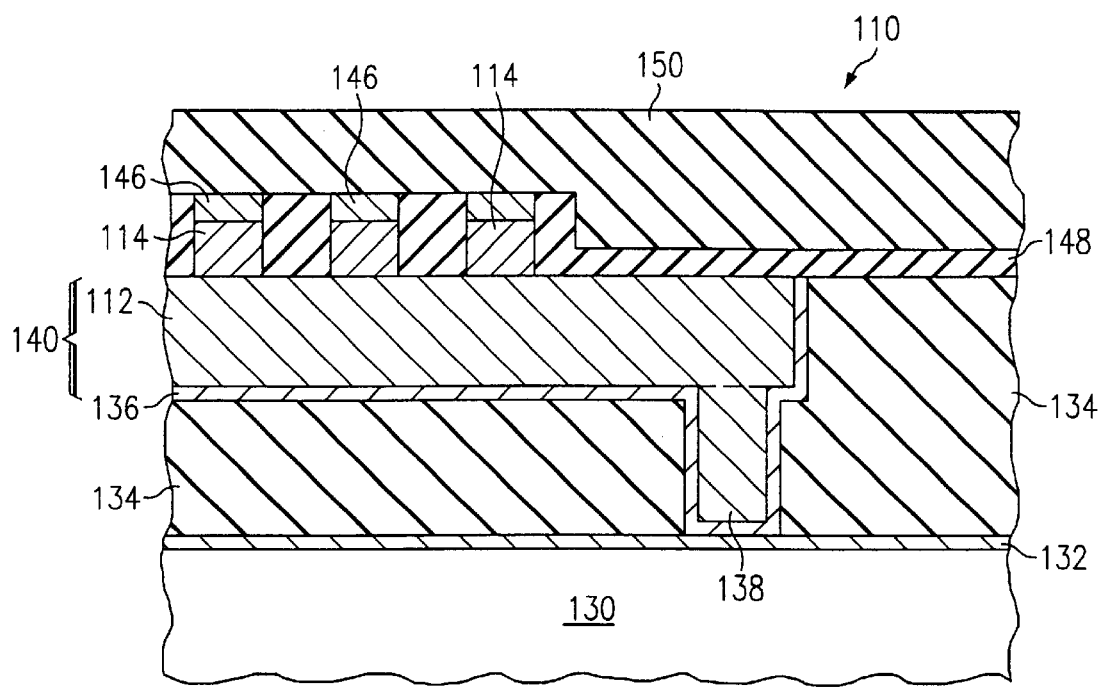
Figure 8:
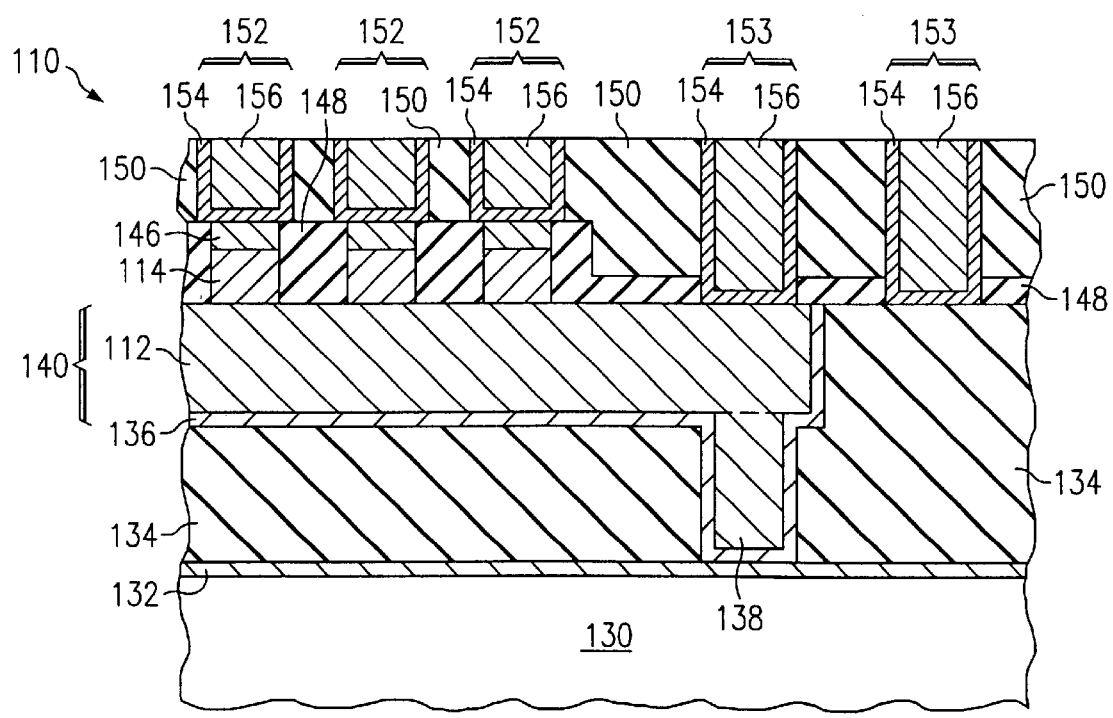

Processing of the MRAM device is continued, as shown in FIGS. 7 and 8. A second insulating layer 148 may be deposited over the MTJ's, 114 and hard mask 146, as shown in FIG. 7. The second insulating layer 148 preferably comprises a nitride such as $Si_xN_y$ and may alternatively comprise an oxide, for example. A third insulating layer 150 is deposited over the wafer 110. The third insulating layer 150 may comprise an inter-level dielectric, for example, such as $Si_{O2}$ or other low-dielectric or high-dielectric constant materials, as examples.

A damascene process may be used to form second conductive lines 152 and contacts 153 within the third insulating layer 150, as shown in FIG. 8. Lines 152 and contacts 153 may comprise a liner 154 and conductive fill material 156, for example. Conductive lines 152 and contacts 153 may be part of a metallization layer, and may comprise the same material or a different material than the first conductive lines 140, for example.

Figure 9:
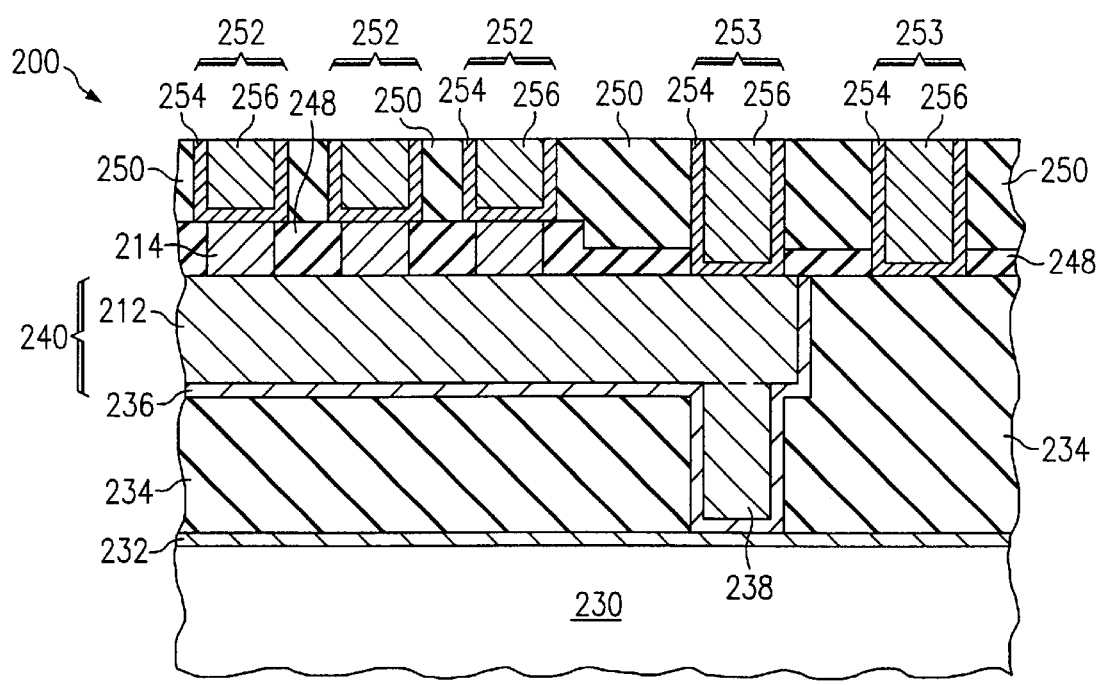
FIG. 9 shows a cross-sectional view of an MRAM device in accordance with an embodiment of the present invention.

Advantageously, the hard mask 146 may comprise a material suitable to be left remaining in the finished MRAM device, us shown in FIGS. 7 and 8. Alternatively, the hard mask 146 may be removed from over the MTJ's 114 before completing the fabrication of the MRAM device, as shown in an alternative embodiment in FIG. 9.

Embodiments of the present invention achieve technical advantages as method of forming a hard mask over a magnetic stack material layer of an MRAM device that does not require a metal etch process. This results in a pattern shape of a lithography mask being transferred to MTJ's 114 that is better preserved compared with methods of forming hard masks that require a metal etch process. Hard mask formation using metal etch processes typically have biases, resulting in patterns that are smaller than desired and corner rounding of features. Forming a hard mask for a magnetic material stack using a plate-through process in accordance with embodiments of the invention provides a method of precisely patterning of MTJ's 114 an MRAM device.

Further advantages of embodiments of the invention include process simplification and better contraindication control. The lithography process window is improved, because the process window for printing voids in a material is, in general, larger than process windows for printing pillars.

Embodiments of the present invention are described with reference to a particular application for cross-point MRAM devices herein; however, embodiments of the invention also have application in other MRAM device designs and other resistive semiconductor devices.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description.

In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a resistive semiconductor memory device, comprising:
   forming a plurality of first conductive lines;
   forming a magnetic stack material over the first conductive lines;
   depositing a resist over the magnetic stack material;
   patterning the resist;
   removing portions of the resist to expose regions of the magnetic stack material;
   depositing a hard mask material over the exposed regions of the magnetic stack material to form a hard mask;
   removing remaining portions of the resist;
   etching the magnetic stack material in a pattern aligned with the hard mask; and
   removing the hard mask.

2. The method according to claim 1, wherein depositing the hard mask material comprises depositing a metal.

3. The method according to claim 2, wherein depositing the hard mask material comprises depositing approximately 10 to 40 nm of material.

4. The method according to claim 2, wherein depositing the hard mask material comprises a plating process.

5. The method according to claim 4, wherein depositing the hard mask material comprises sputtering, physical vapor deposition (PVD), evaporation deposition or combinations thereof.

6. The method according to claim 4, wherein depositing the hard mask material comprises an electroplating process.

7. The method according to claim 6, wherein the electroplating process comprises depositing Cu, Au, or Ni.

8. The method according to claim 4, wherein depositing a hard mask material comprises an electro-less plating process.

9. The method according to claim 8, wherein the electro-less plating process comprises depositing Pd/Au, Pd/Ni, CoPW, or CoP.

10. The method according to claim 2, wherein depositing the hard mask material comprises depositing TaN, Ta, TiN, or W.

11. The method according to claim 1, wherein depositing the hard mask material comprises plating, sputtering, physical vapor deposition (PVD), evaporation deposition, or combinations thereof.

12. The method according to claim 1, wherein the resistive semiconductor memory device comprises a magnetic random access memory (MRAM) device, wherein etching the magnetic stack material comprises using the hard mask to pattern the magnetic stack material to form magnetic tunnel junctions (MTJ's).

13. The method according to claim 1, further comprising forming a plurality of second conductive lines over the MTJ's.

14. The method according to claim 1, wherein depositing the magnetic stack material comprises:
   depositing a plurality of first magnetic material layers;
   forming an insulator over the first magnetic material layers; and
   depositing a plurality of second magnetic material layers.

15. A method of fabricating a magnetic random access memory (MRAM) device comprising:
   providing a workpiece;
   depositing a first insulating layer over the workpiece;
   forming a plurality of first conductive lines within the first insulating layer;
   depositing a magnetic stack material over the first conductive lines and first insulating layer;
   depositing a resist over the magnetic stack material;
   patterning the resist;
   removing portions of the resist to expose regions of the magnetic stack material;
   depositing a hard mask material over the exposed regions of the magnetic stack material through the resist to form a hard mask;
   removing the resist;
   using the hard mask to pattern the magnetic stack material and form magnetic tunnel junctions (MTJ's)
   forming a plurality of second conductive lines proximate the MTJ's; and
   removing the hard mask.

16. The method according to claim 15, wherein depositing the hard mask material comprises a plating process, sputtering, physical vapor deposition (PVD), evaporation deposition, or combinations thereof.

17. The method according to claim 16, wherein depositing the hard mask material comprises depositing a metal.

18. The method according to claim 7, wherein depositing the hard mask material comprises depositing Cu, Au, Ni, Pd/Au, Pd/Ni, CoPW, CoP, TaN, Ta, TiN, W, or combinations thereof.

19. The method according to claim 17, wherein depositing the hard mask material comprises an electro-plating or electro-less plating process.

20. The method according to claim 15, wherein forming the magnetic stack material comprises:
   depositing a plurality of first magnetic material layers;
   forming an insulator over the first magnetic material layers; and
   depositing a plurality of second magnetic material layers.

* * * * *